United States Patent [19]

Bertotti et al.

[11] Patent Number: 5,021,860
[45] Date of Patent: Jun. 4, 1991

[54] INTEGRATED DEVICE FOR SHIELDING THE INJECTION OF CHARGES INTO THE SUBSTRATE

[75] Inventors: Franco Bertotti, Milan; Paolo Ferrari, Gallarate; Maria T. Gatti, Milan, all of Italy

[73] Assignee: SGS-Thomson Microelectronics S.r.l., Agrate Brianza, Italy

[21] Appl. No.: 256,008

[22] Filed: Oct. 11, 1988

[30] Foreign Application Priority Data

Oct. 15, 1987 [IT] Italy ................................ 22290 A/87

[51] Int. Cl.$^5$ ........................................... H01L 27/082
[52] U.S. Cl. ..................... 357/48; 307/296.2; 357/86
[58] Field of Search .................. 357/48, 86; 307/296.2

[56] References Cited

U.S. PATENT DOCUMENTS

| | | | |
|---|---|---|---|
| 3,890,634 | 6/1975 | Ruegg | 357/48 |
| 3,931,634 | 1/1976 | Knight | 357/48 |
| 4,021,687 | 5/1977 | Yoshimura | 357/48 |
| 4,233,618 | 11/1980 | Genesi | 357/48 |
| 4,466,011 | 8/1984 | Van Zanten | 357/48 |
| 4,496,849 | 1/1985 | Kotowski | 357/48 |

Primary Examiner—William D. Larkins
Attorney, Agent, or Firm—Guido Modiano; Albert Josif

[57] ABSTRACT

The device for shielding the electrons injected towards the substrate by an epitaxial pocket which reaches a negative voltage with respect to said substrate, comprises a debiasing transistor arranged in reverse configuration (with collector and emitter swapped) in the same epitaxial pocket reaching a negative voltage. The transistor is connected with its emitter and its collector between the buried layer of the pocket reaching a negative voltage and the substrate, so as to debias the junction formed by the buried layer and the substrate.

5 Claims, 1 Drawing Sheet

INTEGRATED DEVICE FOR SHIELDING THE INJECTION OF CHARGES INTO THE SUBSTRATE

BACKGROUND OF THE INVENTION

The present invention relates to an integrated device for shielding the injection of charges into the substrate.

As is known, when driving inductive and/or capacitive loads, for the correct behavior of the system it is necessary to recirculate or discharge the current accumulated in the load towards the ground. If a load is driven by an integrated device, the substrate of the device is clamped to the ground and the current recirculation occurs through the epitaxial pocket diode (which constitutes the cathode) and the substrate (which defines the anode of the diode). In order to recirculate or discharge the current stored by the load at the switch off of the load driving devices, this diode is forward biased and the epitaxial pocket reaches a negative voltage with respect to the ground. In this condition the epitaxial pocket with negative voltage (recirculation or flyback pocket) injects current into the substrate, behaving like the emitter of a parasite NPN transistor, and any other epitaxial pocket of the same device, which is at higher voltage than the substrate, collects the injected electrons, behaving like the collector of said parasite transistor.

This injection of charges into epitaxial pockets at high voltage must be avoided, as it entails the following problems:

(1) the circuit has an undesirable dissipation of power;

(2) if the epitaxial pockets are the base of a lateral PNP transistor, this injected charge causes said PNP transistor (e.g. the driving ones) to switch on again;

(3) the base current of lateral PNP transistors increases, with malfunction of the device.

In order to avoid the above described problems, two solutions are currently used, both having the purpose of creating a path with lower impedance than the other epitaxial pockets of the circuit and therefore such as to collect all the current injected by the epitaxial pocket with negative voltage with respect to the ground. Such solutions have a similar structure (see FIG. 1), comprising an isolated epitaxial pocket surrounding the entire epitaxial pocket which can reach a negative voltage with respect to the ground. Said isolated pocket comprises, in its interior, a buried layer and a sinker region, both being heavier doped than the epitaxial layer. This structure is then connected to the ground or to the supply, depending on the adopted solution.

Such known solutions, however, do not solve the problem of injected charges. In fact on one hand they are unable to completely eliminate the current towards the circuit and on the other they do not reduce the dissipated power. The solution comprising the connection to the ground is furthermore scarcely competitive with respect to the epitaxial pockets at high voltage which tend to better gather the injected charges than the epitaxial pocket connected to the ground, while the solution teaching the connection to the supply is disadvantageous in terms of power dissipation since the injected current is collected towards the highest voltage point.

Another known solution is described in the U.S. patent application No. 07/099.044 of 9.21.1987 (now U.S. Pat. No. 4,890,149) assigned to the same Assignee and comprises four integrated structures constituting charge collector regions or structures adapted to limit the voltages of the regions of the device. Though this solution fully solves the problem of injected charges, it is however not always applicable due to its considerable bulk.

SUMMARY OF THE INVENTION

Given this situation, the aim of the present invention is to provide an integrated device for shielding the injection of charges into the substrate, capable of eliminating the disadvantages featured by known devices.

Within this aim, a particular object of the present invention is to provide an integrated device which is highly efficient in absorbing the current injected by the flyback pocket, as well as having a simple structure and small dimensions.

Another object of the present invention is to provide an integrated device capable of minimizing the power dissipated in the circuit, thus improving the characteristics of reliability and the field of application of the entire integrated device.

Not least object of the present invention is to provide an integrated device which has a conceptually simple structure which is easily manufactured using the methods and machines currently in use for the manufacture of integrated electronic devices, so as to not entail substantial complications in the manufacture of the device and so as to have modest production costs.

This aim, the mentioned objects and others which will become apparent hereinafter are achieved by an integrated device for shielding the injection of charges into the substrate, as described in the accompanying claims.

BRIEF DESCRIPTION OF THE DRAWINGS

The characteristics and advantages of the invention will become apparent from the description of a preferred but not exclusive embodiment, illustrated only by way of non-limitative example in the accompanying drawings, wherein.

DESCRIPTION OF THE PREFERRED EMBODIMENTS

Figure 1:
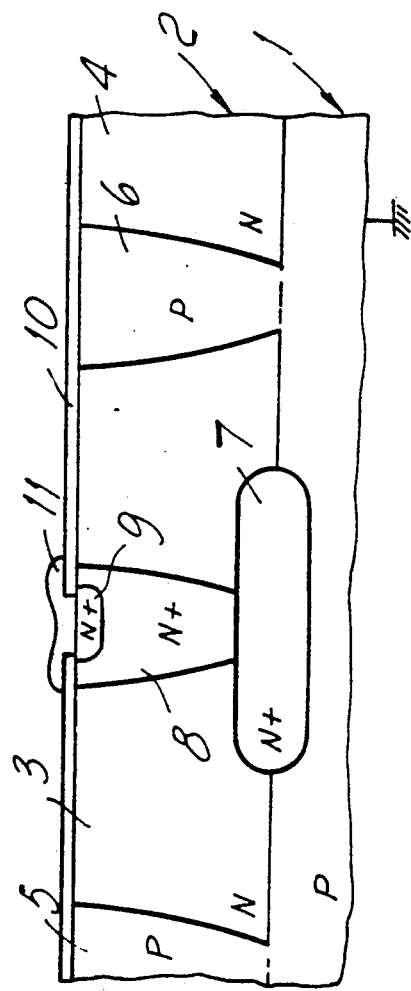
FIG. 1 is a transverse sectional view taken through a semiconductor wafer, illustrating the protection structure according to a known solution.

Reference should initially be made to FIG. 1, illustrating the structure of the known solutions, which comprises an isolated pocket, which is provided all around the flyback epitaxial pocket, and is connected to the ground or to the supply. In detail, FIG. 1 illustrates the P-type substrate 1, the N-type epitaxial layer 2, and P-type isolation regions 5 and 6 which extend from the main face of the device up to the substrate 1 and divide the epitaxial layer 2 into a plurality of isolated pockets, comprising the pocket 3 accommodating the known protection device and the pocket 4, which constitutes e.g. the flyback pocket connected to the load and intended to reach a lower voltage than the substrate in certain states of operation of the system. Within said pocket 3 there is a buried layer 7 having $N^+$-type conductivity, extending on the junction between said substrate and said pocket 3. A sinker region, with $N^+$-type conductivity, extends from the buried layer 7 up to the main surface of the device. At said face, inside the sinker region, there is an N+-type region 9 connected to a contact 11 suitable to allow the connection of the protection structure to the ground or to the supply. An oxide layer 10 which covers the entire surface of the device is furthermore provided.

Figure 2:
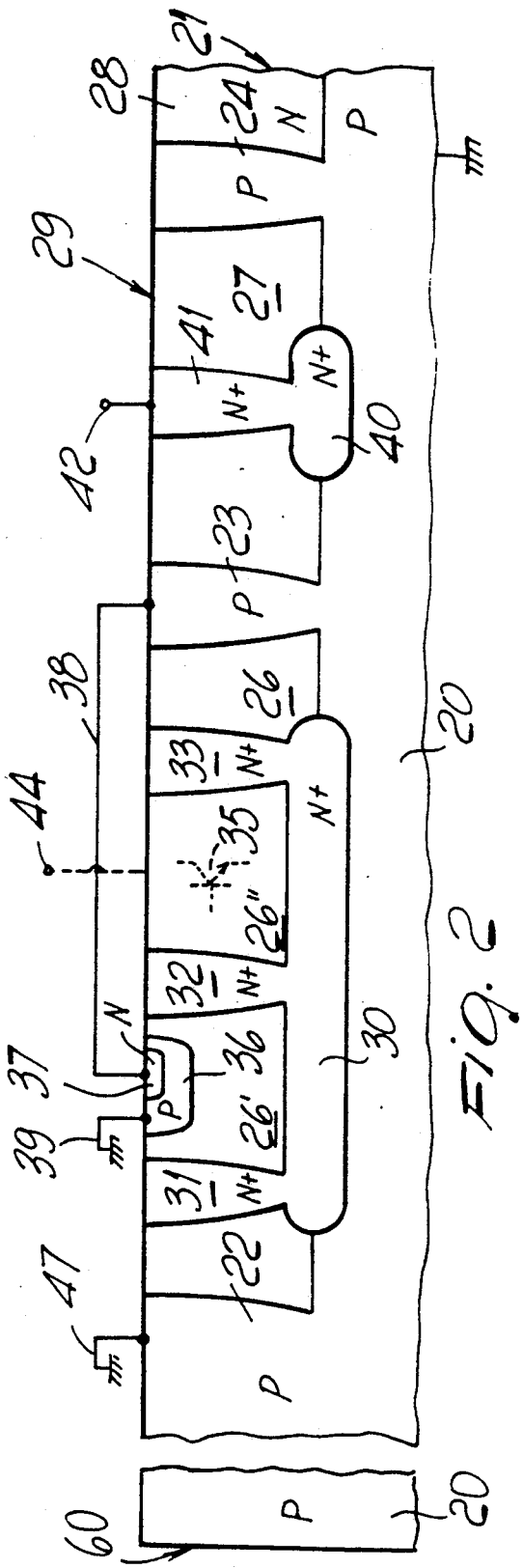
FIG. 2 is a transverse sectional view taken through a semiconductor wafer incorporating the integrated device according to the invention.

FIG. 2 instead illustrates the structure of the integrated protection device according to the invention. In the figure, the reference numeral 20 indicates the substrate with P-type conductivity, while the reference numeral 21 generally indicates the epitaxial layer with N-type conductivity superimposed on the substrate and forming therewith a junction. A plurality of isolation regions 22, 23, 24 with P-type conductivity extends from the main face of the device 29 down to the substrate 20 and divides the epitaxial layer 21 into a plurality of isolated pockets, indicated herein by the reference numerals 26 to 28. In the case illustrated in the figure, the reference numeral 26 indicates the flyback epitaxial pocket connected to the load, while the reference numerals 27 and 28 indicate two other epitaxial pockets which have a higher potential than the substrate and can therefore constitute the collector of parasite transistors, as will be explained in detail hereinafter.

As can be seen in FIG. 2, at the junction between the epitaxial pocket 26 and the substrate 20 there is a buried layer 30 having N+-type polarity from which there extend sinker regions with N+-type conductivity, indicated by the reference numerals 31, 32 and 33. Said sinker regions delimit, and mutually separate, within said epitaxial pocket 26, a first epitaxial region 26' in which a debiasing structure is implemented, as will be described in further detail hereinafter, and an epitaxial region 26", in which the load driving element or elements are provided, as indicated in the figure by the transistor 35 drawn in broken lines. Typically, said region 26" can be a finger of a power transistor having its output terminal (indicated in FIG. 2 by the reference numeral 44) connected to the load. Naturally said region 26" is repeated as many times as there are fingers of the power transistor of the driving circuit.

Inside the epitaxial region 26', and thus at a distance from isolation regions 22, 23, there is furthermore a region 36 with P-type conductivity, which accommodates in turn a region 37 with N-type conductivity. Said regions 36 and 37 thus constitute the base and the collector of a transistor having its emitter constituted by the buried region 30. According to the invention, the base region 36 has a surface portion extending at the main face 29 of the device which is directly connected to the lower reference potential line or ground (as indicated by the reference numeral 39) while the collector region 37 has a surface portion extending at the main face and connected to the isolation region 23 by means of a metal line or a polycrystalline silicon connection 38 provided on the face 29 of the device.

As can be seen in FIG. 2, the isolation region 22 is furthermore connected to the ground (at 47) while at the junction between the epitaxial pocket 27 and the substrate 30 there is a buried layer 40 with N+-type conductivity, connected to a sinker region indicated by the reference numeral 41 and connected to the terminal 42.

Figure 3:
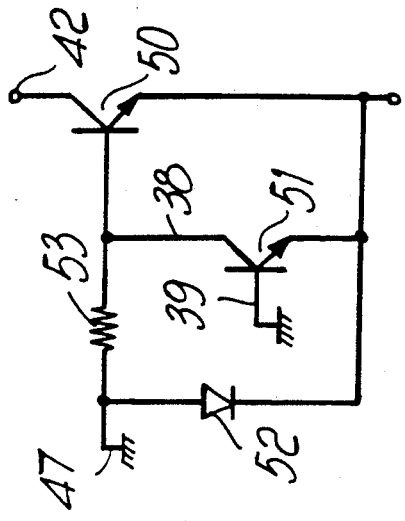
FIG. 3 is an equivalent electric diagram of the device of FIG. 2.

The equivalent electric diagram of the structure of FIG. 2 can be deduced from FIG. 3. In particular in this figure the reference numeral 51 indicates the debiasing transistor formed by the buried layer 30 (which constitutes the emitter), by the region 36 (which constitutes the base) and by the region 37 which constitutes the collector. The reference numeral 50 instead indicates the parasite transistor formed by the buried layer 30 (emitter), by the substrate 20 (base) and by an insulated pocket of the circuit (e.g. the pocket 27 with the buried layer 40 which constitutes the collector). FIG. 3 also illustrates the diode 52 which forms at the junction between the substrate 20 (which constitutes the anode) and the buried layer 30 (which constitutes the cathode). Said figure also illustrates the resistor 53 which forms along the isolation 23, the substrate 20 and the isolation 22 between the collector 37 of the debiasing transistor 51 and the ground 47.

The described structure operates as follows. The transistor 51, which is connected with its emitter and its collector in parallel to the base-emitter junction of the parasite transistor 50, causes the debiasing of said junction in the region thereof which is directed towards the epitaxial pockets which are at high voltage with respect to the flyback epitaxial pocket 26 during discharging of the current stored in the load. This debiasing causes the decrease of the collector current of the parasite transistor 50, i.e. the decrease of the charges injected towards the high-voltage epitaxial pockets 27, 28. Advantageously, the debiasing transistor 51 is arranged in a first side portion of the epitaxial pocket 26 which is in contact with isolation region 22 and is directed towards the outer lateral edge of the circuit 60 (towards the cutting or scribbling line), so as to prevent it from injecting charges towards the collectors of the parasite transistors, while the load driving transistor 35 is arranged in another side portion of the flyback pocket 26 opposite to the first side portion and in contact with isolation region 23. Furthermore the debiasing transistor advantageously has an inverse configuration, with the collector and emitter swapped. In this manner the debiasing transistor does not interfere with the electric characteristics of the power transistor or of any other element provided within the epitaxial region 26" (in fact by virtue of this configuration there is no reduction of the breakdown voltage of the power transistor 35, since the base-emitter junction of the debiasing transistor is capable of withstanding the voltage $V_{CBO}$ of said power transistor). Furthermore the described reverse configuration allows the insertion of the debiasing transistor within said epitaxial flyback pocket, thus obtaining a considerable saving in area without reducing the efficiency of the entire integrated circuit.

It should be noted that in this structure the emitter of the debiasing transistor is formed by the same layer which constitutes the emitter of the parasite transistor, thus providing an intrinsic connection between the two emitters.

The diode 52 formed between the substrate 20 and the buried layer 30, which collects the current injected by the buried layer 30 towards the ground 47 on the side directed towards the lateral edge of the silicon wafer, also takes part in the charge shielding process.

It should furthermore be noted that the connection shown between the collector layer 37 of the biasing transistor and the isolation region 23 causes the forming of the resistor 53 between the collector 37 and the ground 47 so that along this resistor there is a small voltage drop which further debiases the buried layer/substrate junction.

As can be seen from the preceding description, the invention fully achieves the intended aims. A structure is in fact provided which has maximum efficiency in eliminating the currents injected by the epitaxial layer 26" and by the buried region 30 towards the substrate 20 by virtue of the debiasing of said junction on one hand and by virtue of the provision of a charge collector path by means of the diode 52 on the other hand.

The described structure furthermore allows to minimize the dissipated power by virtue of the decrease in the charges injected as a consequence of the debiasing and of the collection of most of the current towards the ground by means of the diode.

It should be noted that the described solution has extremely small dimensions, with consequent optimization of the efficiency-bulk ratio.

Finally, the fact is furthermore stressed that the described structure is circuitally extremely simple, and does not require specific manufacturing steps for its manufacture, since the regions provided in the debiasing transistor can be formed simultaneously with the various regions of the driving device.

The invention thus conceived is susceptible to numerous modifications and variations, all of which are within the scope of the inventive concept. In particular the fact is stressed that the conductive connection lines including the connection 38 between the collector region 37 and the isolation 23 and the ground connections 39 and 47 can be obtained by means of metal lines or by means of polysilicon lines, preferably extending on the main face of the device.

Where technical features mentioned in any claim are followed by reference signs, those reference signs have been included for the sole purpose of increasing the intelligibility of the claims and accordingly, such reference signs do not have any limiting effect on the scope of each element identified by way of example by such reference signs.

We claim:

1. An integrated device for shielding injection of charges into a substrate, comprising:
   a substrate having a first conductivity type and being connected to a reference potential line,
   an epitaxial layer superimposed on said substrate, having a second conductivity type opposite to said first conductivity type and defining a main face of the device, said epitaxial layer and said substrate defining together a junction,
   a plurality of isolation regions having said first conductivity type and extending transversely to said epitaxial layer from said main face to said substrate and forming, in said epitaxial layer, at least one isolated flyback pocket connected to a load connection terminal and forming a flyback diode together with said substrate,
   a buried layer of said second conductivity type extending between said epitaxial flyback pocket and said substrate along a part of said junction,
   a first region of said first conductivity type embedded in said flyback epitaxial pocket at a distance from said isolation regions and having a portion thereof which extends at said main face of the device and is directly connected to said reference potential line,
   a second region of said second conductivity type embedded in said first region and having a surface portion thereof extending at said main face of the device, said surface portion of said second region being directly connected to one of said isolation regions, said buried layer, said first region and said second region respectively forming emitter, base and collector regions of a debiasing transistor.

2. An integrated device for shielding injection of charges into a substrate, comprising:
   a substrate having a first conductivity type and being connected to a reference potential line,
   an epitaxial layer superimposed on said substrate, having a second conductivity type opposite to said first conductivity type and defining a main face of the device, said epitaxial layer and said substrate defining together a junction,
   a plurality of isolation regions having said first conductivity type and extending transversely to said epitaxial layer from said main face to said substrate and forming, in said epitaxial layer, at least one isolated flyback pocket connected to a load connection terminal and forming a flyback diode together with said substrate,
   a load driving element integrated in said flyback epitaxial pocket,
   an emitter region of said second conductivity type extending between said epitaxial flyback pocket and said substrate along said junction,
   a base region of said first conductivity type extending in and being surrounded by said flyback epitaxial pocket, said base region having a surface portion extending at said main face of the device and being directly connected to said reference potential line,
   a collector region of said second conductivity type extending and being completely surrounded by said base region, said collector region defining a collector surface portion extending at said main face,
   a conductive connection line having an end thereof connected to said collector surface portion and another end thereof connected to one of said isolation regions,
   resistive means extending from said another end of said conductive connection line along said one isolation region and said substrate to said reference potential line.

3. An integrated device for shielding injection of charges into a substrate, comprising:
   a substrate having a first conductivity type,
   an epitaxial layer superimposed on said substrate, having a second conductivity type opposite to said first conductivity type and defining a main face of the device, said epitaxial layer and said substrate defining together a junction,
   a plurality of isolation regions having said first conductivity type and extending transversely to said epitaxial layer from said main face to said substrate, said isolation regions comprising at least a first isolation region connected to a reference potential line and a second isolation region extending at a distance from said first isolation region and delimiting therewith an isolated epitaxial flyback pocket overlying a substrate portion and defining a first side portion within said epitaxial flyback portion, in contact with said first isolation region and a further side portion opposite to said first side portion within said epitaxial flyback portion, and in contact with said second isolation region, said epitaxial flyback pocket being connected to a load connection terminal,
   a buried layer of said second conductivity type extending between said epitaxial flyback pocket and said substrate along a portion of said junction and forming an emitter region, a base region of said first conductivity type embedded in said epitaxial flyback pocket at a distance from said first and second isolation regions and having a portion thereof which extends at said main face of the device, a first conductive connection means extending above the main surface of the device between said base surface portion and said reference potential line, a collector region of said second conductivity type embedded in said base region and having a collector surface portion thereof extending at said main face of the device, a second conductive connection means extending above the main surface of the device and having an end thereof connected to said collector surface portion and another end thereof connected to said second isolation region, said second isolation region, said substrate portion under said flyback epitaxial pocket and said first isolation region defining resistive means extending between said another end of said second conductive connection means and said reference potential line.

4. An integrated device according to claim 3, wherein said base and collector regions extend in said first side portion of said epitaxial flyback pocket and said further side portion accommodates a load driving element.

5. An integrated device according to claim 3, comprising sinker regions of said second conductivity type extending in said epitaxial flyback pocket from said main face of the device to said buried layer and delimiting a first epitaxial region in said first side portion of said epitaxial flyback pocket and a second epitaxial region in said further side portion of said epitaxial flyback pocket, said first epitaxial region accommodating said base and collector regions and said second epitaxial region accommodating a load driving element.

* * * * *